(12) United States Patent
Gu et al.

(10) Patent No.: US 10,304,976 B2
(45) Date of Patent: May 28, 2019

(54) PHOTOVOLTAIC STRUCTURES, SOLAR CELL APPARATUSES AND METHODS

(71) Applicant: Swinburne University of Technology, Hawthorn (AU)

(72) Inventors: Min Gu, Doncaster (AU); Xi Chen, Surrey Hills (AU); Baohua Jia, Balwyn North (AU)

(73) Assignee: Swinburne University of Technology (AU)

( * ) Notice: Subject to any disclaimer, the term of this patent is extended or adjusted under 35 U.S.C. 154(b) by 559 days.

(21) Appl. No.: 14/340,648

(22) Filed: Jul. 25, 2014

(65) Prior Publication Data

US 2015/0027534 A1    Jan. 29, 2015

(30) Foreign Application Priority Data

Jul. 26, 2013   (AU) ................. 2013902777

(51) Int. Cl.
| | |
|---|---|
| *H01L 31/0216* | (2014.01) |
| *H01L 31/0236* | (2006.01) |
| *H01L 31/04* | (2014.01) |
| *H01L 31/0232* | (2014.01) |
| *H01L 31/068* | (2012.01) |
| *B82Y 30/00* | (2011.01) |

(52) U.S. Cl.
CPC .. *H01L 31/02327* (2013.01); *H01L 31/02168* (2013.01); *H01L 31/068* (2013.01); *B82Y 30/00* (2013.01); *Y02E 10/547* (2013.01)

(58) Field of Classification Search
CPC ................. H01L 31/02; H01L 31/0216; H01L 31/02168; H01L 31/0236; H01L 31/02363; H01L 31/04
See application file for complete search history.

(56) References Cited

U.S. PATENT DOCUMENTS

| | | | |
|---|---|---|---|
| 2010/0126567 A1* | 5/2010 | Kaufman ............... | G02B 5/008 136/252 |
| 2013/0193404 A1* | 8/2013 | Koppens ........... | H01L 31/02327 257/9 |
| 2015/0034160 A1* | 2/2015 | Wu ................... | H01L 31/02168 136/262 |

OTHER PUBLICATIONS

Li et al. "Deformation of Wrinkled Graphene" ACS Nano, 2015, 9 (4), pp. 3917-3925 (Year: 2015).*

* cited by examiner

*Primary Examiner* — Susan D Leong
(74) *Attorney, Agent, or Firm* — Harness, Dickey & Pierce, P.L.C.

(57) ABSTRACT

A photovoltaic (PV) structure for generating electrical power from light, the structure including an enhancing layer for increasing the absorption of the light into the structure, the enhancing layer including: a wrinkled graphene layer configured to trap the light in the PV structure; and aluminum nanoparticles configured to scatter the light into the PV structure.

8 Claims, 8 Drawing Sheets

PHOTOVOLTAIC STRUCTURES, SOLAR CELL APPARATUSES AND METHODS

CROSS-REFERENCE TO RELATED APPLICATIONS

This application claims the benefit and priority of Australian Patent Application No. 2013902777, filed Jul. 26, 2013. The entire disclosure of the above application is incorporated herein by reference.

TECHNICAL FIELD

The present invention generally relates to solar cell apparatuses, photovoltaic structures, methods of manufacture and/or methods of use.

BACKGROUND

Efficiency improvements in photovoltaic solar cells are of vital importance to the success of solar cell technology. Plasmonic effects from metallic nanoparticles are capable of improving solar cell performance. If the nanoparticles are integrated into photovoltaic devices with a relatively low surface coverage (usually below 30%), light trapping from plasmonic resonances of the nanoparticles can increase the solar cell absorption, and can thereby enhance the efficiency of conversion of sunlight to electrical energy in the solar cell.

However, plasmonic nanostructures can suffer from destructive absorption, so that the efficiency of plasmonic solar cells is limited, as described in Reference (1). For example, it is a great challenge to increase the efficiency of textured crystalline silicon solar cells to above 19% using conventional plasmonic processes, as described in Reference (2). The destructive absorption of plasmonic nanostructures that reduces solar cell performance is caused by two mechanisms: the Fano effect; and parasitic absorption above the plasmonic resonance that does not contribute to photocurrent.

The Fano effect refers to a destructive interference between the trapped and untrapped light that occurs below the resonance, as described in Reference (3). Among plasmonic materials, aluminium (Al) has a plasmon resonance in the ultraviolet range, where the intensity of solar irradiance is negligible: accordingly, Al-enhanced photovoltaic devices may be used to avoid the Fano effect, and thus improve solar cell efficiency compared to solar cells with silver (Ag) and gold (Au) nanoparticles. However, synthesizing Al nanoparticles and controlling their coverage to be sufficiently low has proven difficult: e.g., Al nanostructures can be too active to be produced by wet-chemical methods at ambient temperature. Although Al nanostructures can be obtained by evaporation of a metal thin film onto a solar cell surface followed by an annealing process, it is difficult to achieve a surface coverage below 30%, as described in Reference (4), and a high coverage of the nanoparticles blocks a significant amount of light, and thereby reduces the solar cell absorption.

The parasitic absorption above the plasmonic resonance that does not contribute to photocurrent is described in Reference (5). This negative effect may be compensated using light trapping materials or structures integrated into the solar cells; however, optical structures deposited on solar cells, e.g., pyramid textures and antireflection coatings, can be complicated or expensive to fabricate.

It is desired to address or ameliorate one or more disadvantages or limitations associated with the prior art, or to at least provide a useful alternative.

SUMMARY

This section provides a general summary of the disclosure and is not a comprehensive disclosure of its full scope or all of its features. The present invention provides a photovoltaic (PV) structure for generating electrical power from light, the structure including an enhancing layer for increasing the absorption of light incident upon the structure, the enhancing layer including: a wrinkled graphene layer configured to trap the light in the PV structure; and aluminium nanoparticles configured to scatter the light into the PV structure.

The present invention also provides a method of manufacturing a photovoltaic (PV) structure, the method including the steps of: providing aluminium nanoparticles to scatter light into the PV structure; and providing a wrinkled graphene layer on or under the aluminium nanoparticles to trap the light in the PV structure.

The present invention also provides a method for forming a photovoltaic (PV) structure, the method including the steps of: providing a thin aluminium film on a soluble substrate; heat treating the thin film to form aluminium (Al) nanoparticles; dissolving the soluble substrate after the heat treating to form a nanoparticle-containing fluid; and depositing the Al nanoparticles on the PV structure to scatter light into the PV structure.

The method may include controlling sizes of the nanoparticles by controlling a thickness of the thin film, a temperature of the heat treating, and/or a duration of the heat treating.

The soluble substrate may be water-soluble, and the nanoparticle-containing fluid may include water.

The present invention also provides a method for generating electrical power from light, the method including the steps of: scattering the light from aluminium (Al) nanoparticles into a photovoltaic (PV) structure; and trapping the light in the PV structure using a wrinkled graphene layer.

The light may pass through the wrinkled graphene layer before being scattered by the Al nanoparticles. The light may be scattered by the Al nanoparticles before passing through the wrinkled graphene layer.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure. Preferred embodiments of the present invention are hereinafter further described, by way of example only, with reference to the accompanying drawings, in which.

Figure 4:
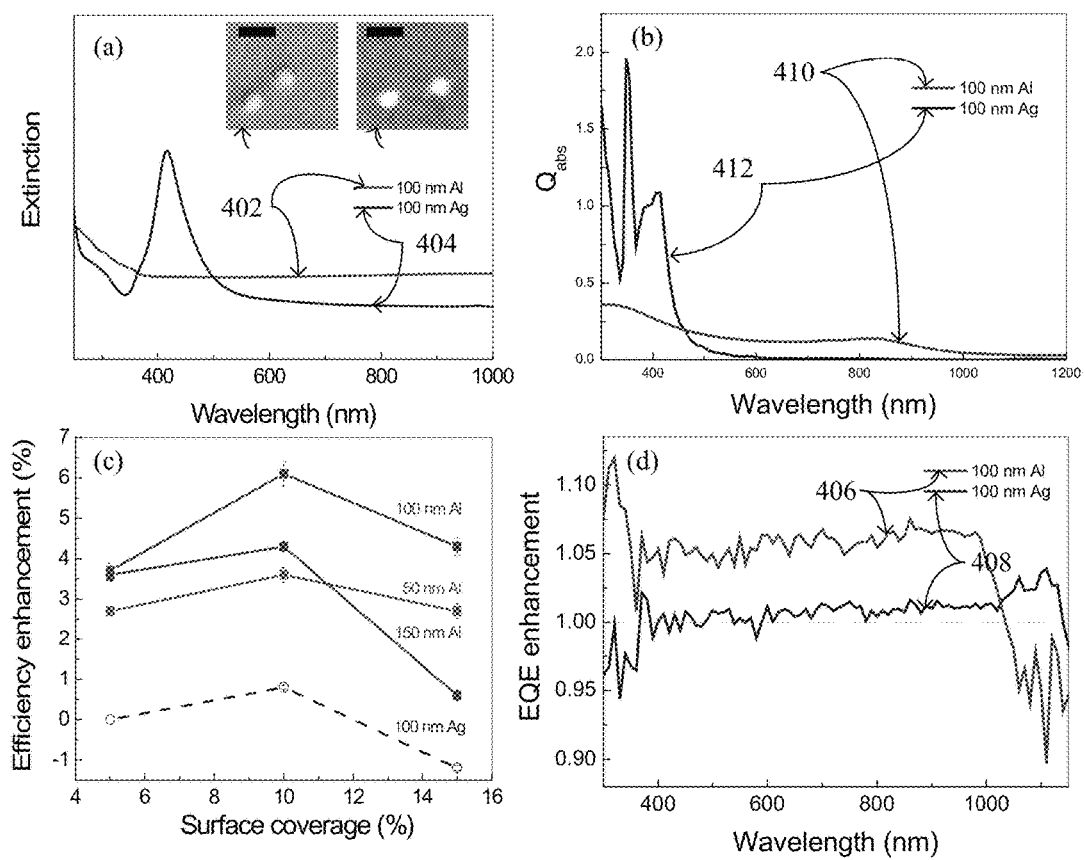
Figure 5:
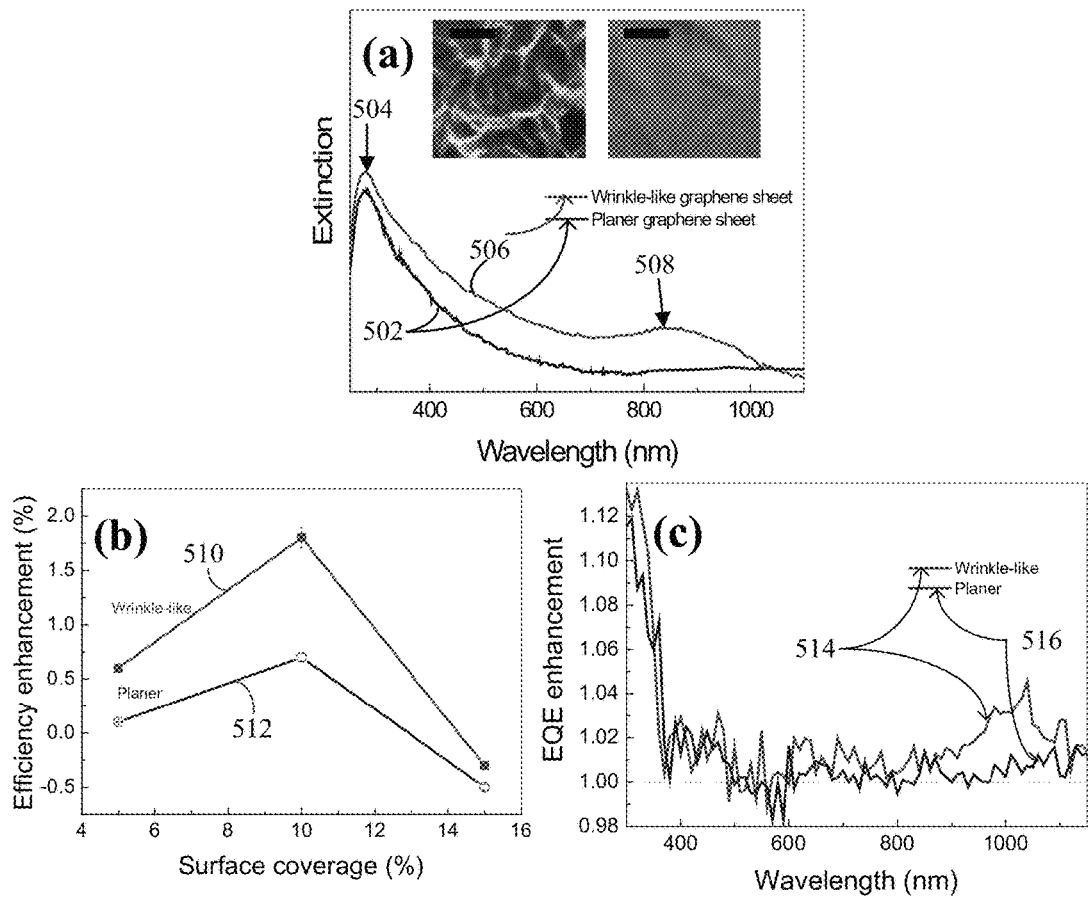
Figure 6:
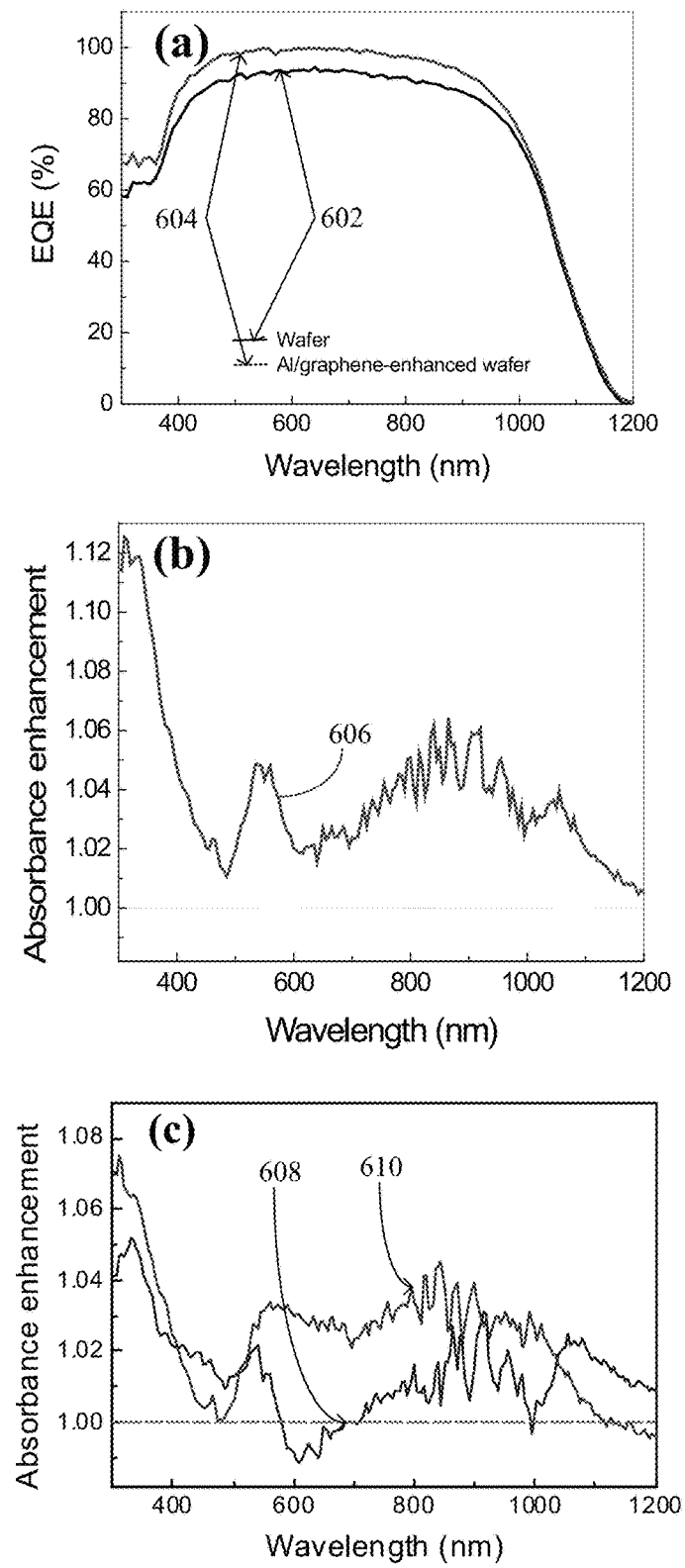
Figure 7:
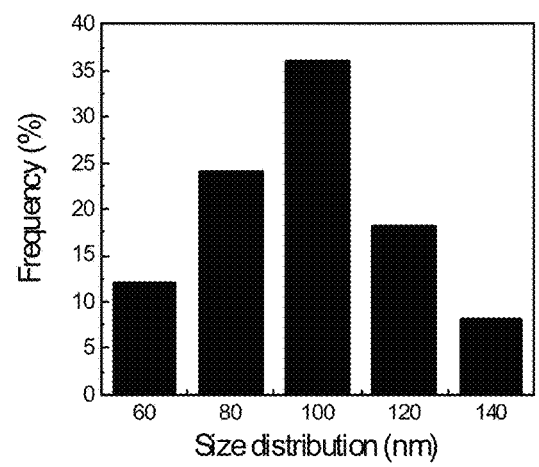
Figure 8:
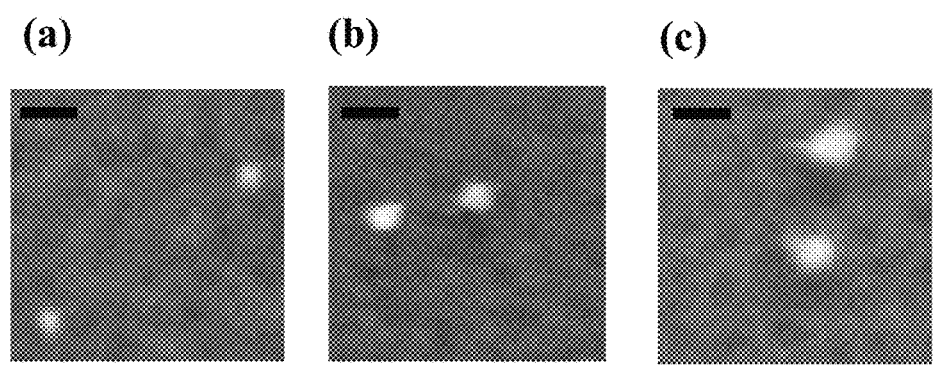
Figure 9:
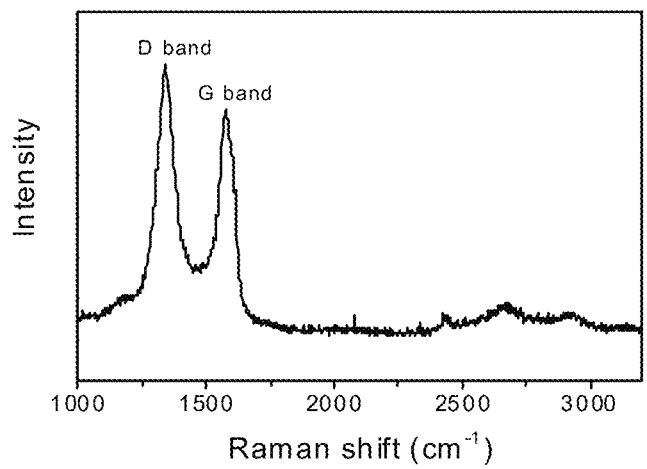
Figure 10:
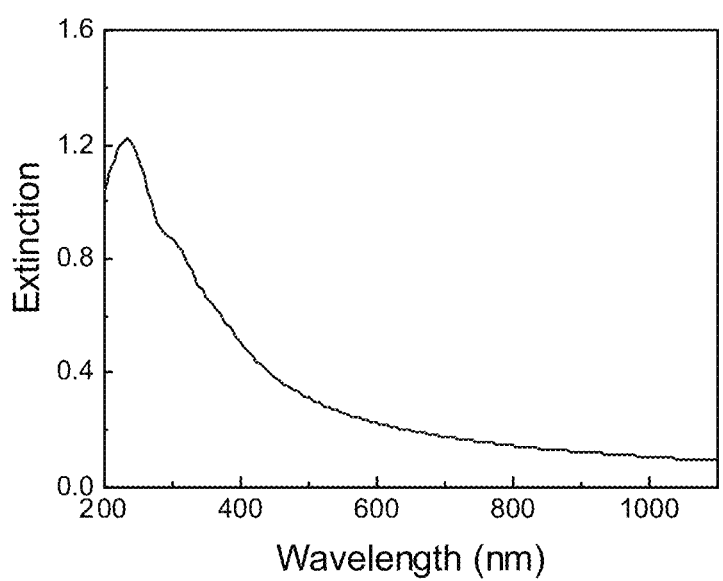
Figure 11:
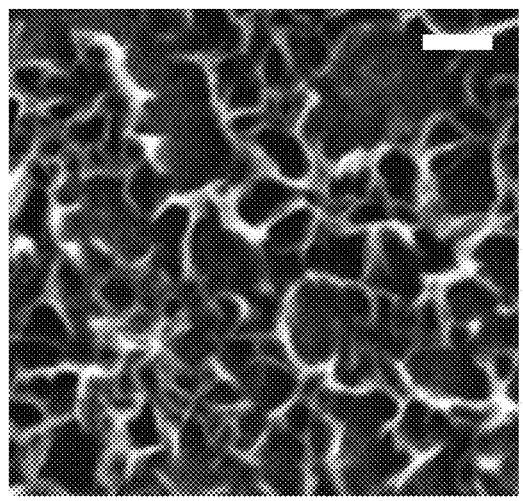

FIG. 4(a) is a graph of ultraviolent-to-visible (UV-vis.) spectra of: an example 100-nm Al nanoparticle aqueous suspension; and an example 100-nm silver (Ag) nanoparticle aqueous suspension, including an inset with SEM images of example 100-nm Ag particles (on the left) and example 100-nm Al particles (on the right) with scale bars of 200 nm;

FIG. 4(b) is a graph of absorbing cross-sections of example 100-nm Al and Ag particles;

FIG. 4(c) is a graph of short-circuit current density ($J_{SC}$) enhancements of example textured crystalline silicon solar cells integrated with Al and Ag nanoparticles with different diameters and surface coverages;

FIG. 4(d) is a graph of External Quantum Efficiency (EQE) enhancement of example crystalline silicon solar cells through the integration of 100-nm Al and Ag particles with about 10% Al nanoparticle coverage;

FIG. 5(a) is a graph of UV-vis. spectra of example wrinkle-like and planer graphene aqueous suspensions, with an inset of SEM images of example wrinkle-like (left) and planer (right) graphene sheets after deposition on the solar cell surface, including a scale bar of 500 nm;

FIG. 5(b) is a graph of $J_{SC}$ enhancements of example textured crystalline silicon solar cells integrated with example wrinkle-like and planar graphene sheets with different surface coverage;

FIG. 5(c) is a graph of EQE enhancements of crystalline silicon solar cells through the integration of example wrinkle-like and planer graphene sheets with about 10% graphene surface coverage;

FIG. 6(a) is a graph of EQE curves for example crystalline silicon solar cells (black) and example Al/graphene-enhanced crystalline silicon solar cells (red);

FIG. 6(b) is a graph of absorption enhancement of crystalline silicon solar cells through the integration of example 100-nm Al nanoparticles and wrinkle-like graphene sheets with under 10% surface coverage;

FIG. 6(c) is a graph of absorption enhancement of crystalline silicon solar cells through example 100-nm Al nanoparticle integration under 10% coverage (upper), and example crystalline silicon solar cells with Al nanoparticle integration under 10% coverage (lower);

FIG. 7 is a bar graph of a size distribution of nominally "100-nm" example Al nanoparticles;

FIG. 8(a) is an SEM image of example 50-nm Al nanoparticles with a scale bar of 200 nm;

FIG. 8(b) is an SEM image of example 100-nm Al nanoparticles with a scale bar of 200 nm;

FIG. 8(c) is an SEM image of example 150-nm Al nanoparticles with a scale bar of 200 nm;

FIG. 9 is a graph of a Raman spectrum of example wrinkle-like graphene sheets;

FIG. 10 is a graph of a UV-Vis. extinction spectrum of an example graphene oxide aqueous suspension; and FIG. 11 is an SEM image of an example Al-nanoparticle-enhanced and graphene-enhanced solar cell with Al nanoparticles located behind wrinkle-like graphene sheets, including a scale bar of 500 nm.

DETAILED DESCRIPTION

Overview

Described herein are solar cell apparatuses, photovoltaic (PV) structures, and methods of manufacturing said solar cell apparatuses (which are also referred to as "photovoltaic devices") and PV structures, and methods of using said apparatuses and structures. The solar cell apparatuses have enhanced solar conversion efficiencies caused by inclusion of the PV structures with an enhancing layer that improves trapping of incident sunlight in the cells. The enhancing layer includes: aluminium (Al) nanoparticles (e.g., nanostructures and/or nanospheres); and nano-wrinkled sheets (e.g., wrinkled graphene sheets) in a wrinkled graphene layer.

Described herein is a photovoltaic (PV) structure for generating electrical power from light, the structure including an enhancing layer for increasing the absorption of light incident upon the structure, the enhancing layer including: a wrinkled graphene layer configured to trap the light in the PV structure; and aluminium nanoparticles configured to scatter the light into the PV structure.

Described herein is a method of manufacturing a photovoltaic (PV) structure, the method including the steps of: providing aluminium nanoparticles to scatter light into the PV structure; and providing a wrinkled graphene layer on or under the aluminium nanoparticles to trap the light in the PV structure.

Described herein is a method for forming a photovoltaic (PV) structure, the method including the steps of: providing a thin aluminium film on a soluble substrate; heat treating the thin film to form aluminium (Al) nanoparticles; dissolving the soluble substrate after the heat treating to form a nanoparticle-containing fluid; and depositing the Al nanoparticles on the PV structure to scatter light into the PV structure.

The method may include controlling sizes of the nanoparticles by controlling a thickness of the thin film, a temperature of the heat treating, and/or a duration of the heat treating.

The soluble substrate may be water-soluble, and the nanoparticle-containing fluid may include water.

Described herein is a method for generating electrical power from light, the method including the steps of: scattering the light from aluminium (Al) nanoparticles into a photovoltaic (PV) structure; and trapping the light in the PV structure using a wrinkled graphene layer.

The light may pass through the wrinkled graphene layer before being scattered by the Al nanoparticles. The light may be scattered by the Al nanoparticles before passing through the wrinkled graphene layer.

Described herein is a solar cell apparatus including: a semiconductor layer for generating electrical power from sunlight; a light-receiving surface for transmitting the sunlight to the semiconductor layer; a wrinkled graphene layer on the light-receiving surface for trapping the sunlight in the solar cell apparatus to improve the generating of the electrical power; and aluminium nanoparticles on the light-receiving surface for scattering the sunlight into the semiconductor layer to improve the generating of the electrical power.

The term "on" may mean "directly on" (e.g., the wrinkled layer or the nanoparticles can be in direct contact with the light-receiving surface) and/or "indirectly on" (e.g., the nanoparticles or the wrinkled layers can have another layer between them and the light-receiving surface).

The wrinkled layer may be on a light-receiving side of the nanoparticles, or the nanoparticles may be on a light-receiving side of the wrinkled layer.

The nanoparticles may have a surface coverage of less than about 30%. The nanoparticles may have a surface coverage of about 5% to about 15%. The nanoparticles may have a surface coverage of about 10%. The nanoparticles may have sizes from about 50 nanometers (nm) to about 150 nm. The nanoparticles may have sizes of about 100 nm. The term "size" may refer to the average diameter of the nanoparticles.

The wrinkled layer may have a surface coverage of up to 100%. The wrinkled layer may have a surface coverage of greater than about 90%. The wrinkled layer may have a surface coverage of greater than about 95%. The wrinkled layer may have a surface coverage of about 100%.

The wrinkled layer may be formed of wrinkled graphene sheets.

The light-receiving surface may be on an incident-light side of the semiconductor layer. The light-receiving surface may be a front surface of the semiconductor layer. The light-receiving surface may be a front surface of an anti-reflection coating on the semiconductor layer. The light-receiving surface may be on a back side of the semiconductor layer, and the solar cell apparatus may include a reflective surface for reflecting light into the back side of the semiconductor layer through the light-receiving surface. The light-receiving surface may be within the semiconductor layer for transmitting the sunlight from a first portion of the semiconductor layer into a second portion of the semiconductor layer.

Described herein is a method for manufacturing a solar cell apparatus, the method including the steps of: providing a wrinkled graphene layer on a light-receiving surface of the solar cell apparatus; and providing aluminium nanoparticles on the light-receiving surface.

The method may include providing the wrinkled layer over the nanoparticles.

The method may include depositing the nanoparticles from a nanoparticle-containing fluid on the light-receiving surface.

The method may include controlling a surface coverage of the nanoparticles by controlling a concentration of the nanoparticles in the nanoparticle-containing fluid.

The method may include forming the nanoparticles by a synthesis method including the steps of: providing a thin aluminium film on a soluble substrate; annealing the thin film to form the nanoparticles; and dissolving the substrate after the annealing to form the nanoparticle-containing fluid.

The synthesis method may include controlling sizes of the nanoparticles by controlling a thickness of the thin film, a temperature of the annealing, and/or a duration of the annealing.

The method may include forming the wrinkled layer from wrinkled graphene sheets synthesised by reduction of graphene oxide.

The method may include depositing the wrinkled layer from a suspension of wrinkled graphene sheets.

The soluble substrate may be water-soluble, and the nanoparticle-containing fluid may include water.

Described herein is a method for forming a solar cell apparatus, the method including the steps of: providing a thin aluminium film on a soluble substrate; annealing the thin film to form aluminium nanoparticles; dissolving the substrate after the annealing to form a nanoparticle-containing fluid; and depositing the nanoparticles on a light-receiving surface of the solar cell apparatus to scatter sunlight into a semiconductor layer of the solar cell apparatus to improve generation of electrical power in the solar cell apparatus.

The method may include controlling sizes of the nanoparticles by controlling a thickness of the thin film, a temperature of the annealing, and/or a duration of the annealing.

The method may include forming the wrinkled layer from wrinkled graphene sheets synthesised by reduction of graphene oxide.

The method may include depositing the wrinkled layer from a suspension of wrinkled graphene sheets.

The soluble substrate may be water-soluble, and the nanoparticle-containing fluid may include water.

Described here is a method for generating electrical power from sunlight, the method including the steps of: scattering the sunlight from aluminium nanoparticles into a semiconductor layer of a solar cell; and trapping the sunlight in the solar cell with a wrinkled graphene layer.

The method may include trapping the sunlight in the solar cell with the nanoparticles, or scattering the sunlight from the nanoparticles into the wrinkled layer.

The PV structure, and thus the solar cell apparatus, can include a thick wafer from a bulk material, e.g., monocrystalline silicon, multicrystalline/polycrystalline silicon, or amorphous silicon. Alternatively, the PV structure or solar cell can include a thin film of material, e.g., a cadmium-telluride thin film on a semiconductor layer, a direct bandgap material (such as copper indium selenide/sulfide), indium gallium nitride, a material with light-absorbing dye, an organic or polymer material, or a silicon thin film.

In the herein-described manufacturing methods, the Al nanostructures and the wrinkled layer are applied in the enhancing layer of the PV structure to a light-receiving surface of the solar cell apparatus to enhance light trapping in the cell. The enhancing layer and the light-receiving surface are both generally parallel with a front surface, i.e., on the light-receiving side, of the solar cell, so the nanoparticles and wrinkled layer are spread generally perpendicular to an incident direction of the sunlight. In embodiments, the light-receiving surface can be any one of the following: a front surface of a solar cell, e.g., a textured crystalline silicon solar cell as described in References (6) and (2); a front surface of an anti-reflection coating layer on a light-receiving side of the solar cell; a front surface of a glass layer at the front (i.e., the sunlight-receiving side) of the cell; a surface inside the cell; and a surface at the back of the cell.

The light-receiving side of any layer may be the front side of the apparatus, i.e., the side that faces the sun when the solar cell apparatus is in use, or may be the back side, i.e., the side that faces away from incident free-space sunlight, when light is reflected from a reflective backing layer of the apparatus (e.g., by a reflective backing in a thin-film solar cell). In some embodiments, the Al nanoparticles and wrinkled graphene layer can be provided on a plurality of layers of the apparatus, e.g., on a front surface (e.g., the AR coating layer) and on a backing surface between a reflective backing layer and the semiconductor layer so that light can be scattered and trapped in the semiconductor layer when it is first incident on the device, and also when it has passed through the thin semiconductor layer and is being reflected back in by the reflective backing. Accordingly, the enhancing layer can be on the front of the solar cell, sandwiched between other layers of the solar cell, or towards a back side of the solar cell.

The described apparatuses and method may be applicable for commercially available solar cells, e.g., textured crystalline silicon solar cells. The described apparatuses and methods may solve current bottleneck issues in the efficiency improvement of commercially available photovoltaic devices.

In alternative embodiments, the PV structure, including the enhancing layer with the Al nanoparticles and the wrinkled graphene layer, can be included in a photodetector for non-solar applications.

In alternative embodiments, the wrinkled layer may be formed by deposition of graphene onto a wrinkled substrate, such that the wrinkled form is provided by the wrinkles of the wrinkled substrate. The wrinkled layer may then be transferred from the wrinkled substrate and deposited onto, or into, the PV structure.

Solar Cell Apparatus

Figure 1A:
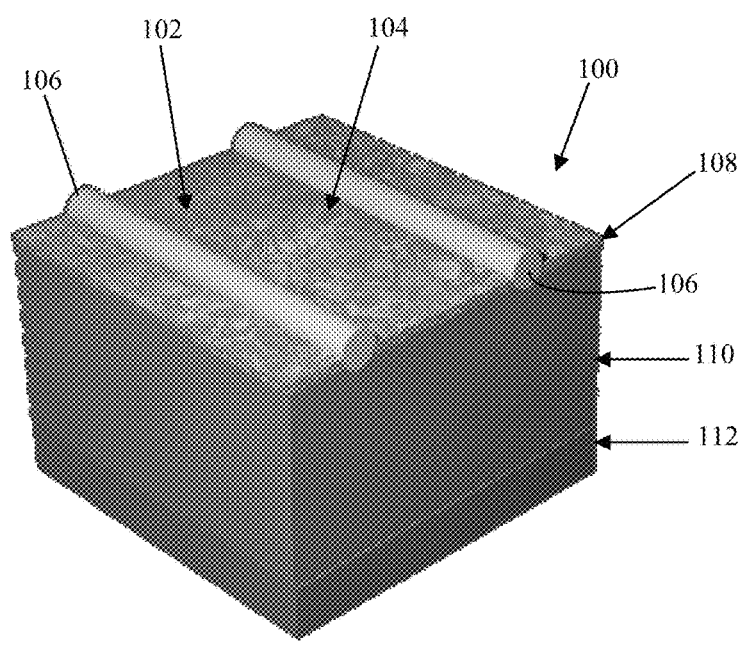
FIG. 1A is a diagram of an aluminium (Al)-nanoparticle-enhanced, and graphene-enhanced textured crystalline silicon solar cell.

A solar cell apparatus 100, as shown in FIG. 1A, includes: Al nanoparticles 102, with a surface coverage of less than 30%, on a light-receiving surface of the solar cell apparatus for scattering incident sunlight into a semiconductor layer 110 to improve generating of electrical power/current in the solar cell apparatus 100; a wrinkled graphene layer formed of wrinkled sheets 104 at least partially covering the nanoparticles 102 on a light-receiving side of the nanoparticles 102, with a surface coverage of up to 100%, for scattering the sunlight into the semiconductor layer 110 to improve the generating of the electrical power; conductive fingers 106 for forming a conductive grid of the solar cell; an antireflection (AR) coating 108 on a non-light-receiving side of the nanoparticles 102; the semiconductor layer 110, e.g., crystalline Silicon (Si) or other material based on the type of solar cell, on a non-light-receiving side of the AR coating 108 (i.e., on a back side of the AR coating 108), the nanoparticles 102 and the sheets 104, configured to absorb the incident sunlight and generating electrical power/current from the sunlight; and a backing 112, e.g., an conductive contact for carrying the electrical power/current from the semiconductor layer 110.

The Al nanoparticles 102 and the wrinkled graphene layer form the enhancing layer, and the enhancing layer and the semiconductor layer 110 are part of the PV structure of the solar cell apparatus 100.

The semiconductor layer 110 and the AR coating 108 can be nano-textured, e.g., as in the front side of commercially available textured crystalline silicon solar cells.

The nanoparticles 102 scatter the incident sunlight into a light-receiving layer (e.g., the AR coating 108) on a non-light-receiving side of the nanoparticles 102 (i.e., thus scattering the sunlight towards and into the semiconductor layer 110) to improve absorption of the sunlight. The Al nanoparticles 102 do not have significant absorption due to the Faro effect at visible wavelengths, but they do have some parasitic absorption.

The sheets 104 can provide a photocurrent enhancement due to light trapping at long wavelengths (i.e., long in the context of sunlight, e.g., about 800 nm to 900 nm, and specifically around 850 nm), and this long-wavelength light trapping can compensate for parasitic absorption loss at corresponding long wavelengths caused by the nanoparticles 102.

In examples, such as those described hereinafter, an efficiency of up to 19.54% can be achieved for a solar cell with the apparatus 100. As presented in Table 1, an efficiency of 19.54% is achieved with a 10% coverage of the nanoparticles 102 and graphene sheets 104, corresponding to a significant 7.1% enhancement compared to the cell without the Al nanoparticles 102 or the graphene sheets 104.

Table 1, below, shows solar cell characteristics for example crystalline silicon solar cells, Al-enhanced crystalline silicon solar cells and Al/graphene-enhanced crystalline silicon solar cells.

| Type | $V_{oc}$ (V) | $J_{sc}$ (mA/cm$^2$) | FF (%) | η (%) |
|---|---|---|---|---|
| Crystalline silicon solar cells | 0.613 | 41.87 | 71.08 | 18.24 |
| Al-enhanced crystalline silicon solar cells | 0.615 | 44.52 | 70.71 | 19.36 |
| Al/graphene-enhanced crystalline silicon solar cells | 0.615 | 44.88 | 70.79 | 19.54 |

An External Quantum Efficiency (EQE) gain for the Al/graphene-enhanced solar cell integrated is demonstrated in FIG. 6(a) showing a substantial broadband EQE improvement from a bare wafer spectrum 602 to an enhanced spectrum 604 by the integration of example Al nanoparticles and wrinkle-like graphene sheets, and this is consistent with the allband absorption enhancement 606 between 300 nm and 1200 nm in FIG. 6(b), which shows that an example textured solar cell with Al nanoparticles has a significant increased broadband absorbance between 300 nm and 1100 nm, arising from the aluminium's effective light trapping. The integration of wrinkle-like graphene sheets with an absorbance spectrum 608 in FIG. 6(c) can further increase the cell absorption around 500, 900 and 1100 nm, which can achieve all band enhancement.

Low-Concentration Aluminium Nanoparticles

Figure 1B:
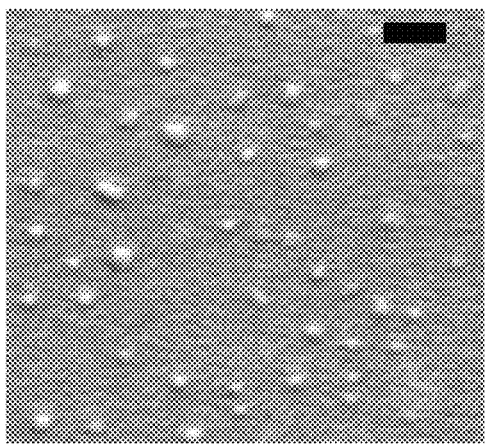
FIG. 1B is an scanning electron microscope (SEM) image of Al nanoparticles with a scale bar of 200 nanometers (nm)

The nanoparticles 102 are prepared using an Al nanoparticle synthesis method described hereinafter. The coverage of the nanoparticles 102 is controlled by controlling a concentration of nanoparticles 102 in a fluid in the nanoparticle synthesis method, thus allowing fabrication of a low-coverage nanoparticle array. The coverage of the nanoparticles 102 can be controlled to be between 0% and 50% of the exposed area of the light-receiving surface, preferably between 0% and 30%, 10% and 20%, or 10% and 15% depending on which light-receiving surface supports the nanoparticles, e.g., 10% for a front surface layer, as shown in the scanning electron microscopic (SEM) image of example Al nanoparticles in FIG. 1B. A surface coverage of about 10% is much lower than that provided by conventional methods.

Size of the nanoparticles 102 is also controlled in the nanoparticle synthesis method. In examples, a nanoparticle size of about 100 nm (e.g., with a distribution as shown in FIG. 7) can be selected as a balance between strong light absorption of smaller nanoparticles, and weak forward scattering of larger nanoparticles (through strong high-order plasmon excitation). The term "size" generally refers to the average diameter of the nanoparticles.

The nanoparticle coverage influences the solar-cell efficiency, as shown in FIG. 4(c). The nanoparticle coverage is between 0% and 30%, and preferably between 5% and 15% or 20%, and in examples, the most preferable coverage is 10%, as shown in FIG. 4(c). For example Al nanoparticle sizes ranging from 50 to 150 nm, 10% surface coverage provided the best photovoltaic performances of the solar cells among the three coverages tested. The 5% coverage may have efficiency gains of up to about 3.6%. The 20% surface coverage may cause blocking of the incident light, thus reducing light absorption in the crystalline silicon layer. The 10% coverage, for 100-nm nanoparticles, can cause a short-circuit photocurrent density ($J_{SC}$) boost from 41.87 to 44.52 mA/cm$^2$, and an energy conversion efficiency increase from 18.24% to 19.36%, for an example textured crystalline silicon solar cell, as shown in Table 1. This efficiency increase can be due to significant light trapping effectiveness of the nanoparticles 102, without even the sheets 104. This enhancement is substantially higher than that provided by depositing other example metallic nanoparticles, e.g., silver nanoparticles of the same size and surface coverage.

For comparison, example 100-nm Ag silver nanoparticles on textured crystalline silicon solar cells with the same surface coverage provided only a 0.8% efficiency enhancement, as shown in Table 2.

Table 2, below, shows solar cell characteristics for example crystalline silicon solar cells and crystalline silicon solar cells integrated by 100 nm Ag nanoparticles under 10% coverage.

| Type | $V_{oc}$ (V) | $J_{sc}$ (mA/cm$^2$) | FF (%) | η (%) |
| --- | --- | --- | --- | --- |
| Crystalline silicon solar cells | 0.611 | 42.84 | 69.29 | 18.14 |
| Ag-enhanced crystalline silicon solar cells | 0.611 | 43.15 | 69.31 | 18.28 |

The nanoparticles 102 have ultra-violet (UV) plasmons that make them more efficient for trapping sunlight than other metallic nanoparticles, e.g., silver nanoparticles. As shown in FIG. 4(a), example 100-nm Al nanoparticles with Al spectrum 402 do not have plasmonic resonances in the visible wavelengths (because they are in the UV range). For comparison, the plasmonic resonance peak of 100 nm silver nanoparticles is at a visible wavelength of 410 nm, as shown in the Ag spectrum 404 of FIG. 4(a). The external quantum efficiency (EQE) enhancement curves presented in FIG. 4(d) indicate that Al nanoparticles produce the significant light trapping below 1000 nm due to their plasmonic properties (see Al curve 406), while silver's Fano effect leads to the EQE decrease below 400 nm (see Ag cure 408). As shown in FIG. 4(b), which is a finite-difference time-domain (FDTD) simulation (e.g., using Lumerical™) of a 100-nm Al particle absorbing cross-section 410 and a 100-nm Ag particle absorbing cross-section 412, the simulated Al particle exhibits much smaller parasitic absorption in the shorter wavelength region than the simulated Ag particle due to the positions of the UV resonances, but the simulated Al particle presents a larger absorbing cross-section in the long wavelength region than the simulated Ag particle. An EQE enhancement dip above 1000 nm in the Al curve 406 for example Al nanoparticles, shown in FIG. 4(d), is due to the long-wavelength parasitic excitation that cannot contribute to photocurrent.

Wrinkle-Like Sheets

The sheets 104 are shaped like wrinkles, and are therefore described herein as "wrinkle-like sheets" or equivalently "wrinkled sheets", which form a wrinkled layer over most of the light-receiving surface. The wrinkled layer is referred to as a bent carbon layer that provides an extinction peak at long visible wavelengths (e.g., around 850 nm). Compared to planar graphene sheets, the wrinkle-like sheets 104 can provide more broadband light-trapping effects. The light-trapping effect of the wrinkled sheets 104 can provide absorption enhancements at optical wavelengths where the Al nanoparticles 102 have destructive parasitic absorption, and thus the wrinkled sheets 104 may at least partially compensate efficiency losses from Al's parasitic absorption.

As shown in FIG. 5(a), an example planar graphene extinction spectrum 502 has a characteristic sp2 extinction peak 504 at around 280 nm, whereas an example wrinkle-like graphene extinction spectrum 506 has both the sp2 extinction peak 504 and an additional long-wavelength extinction peak 508 at about 840 nm. The wrinkle-like graphene sheets 104 can be prepared from the reduction of graphene oxide sheets in a graphene oxide suspension, as described below in the sheet synthesis method; however, an example extinction spectrum of the graphene oxide suspension does not include the long-wavelength extinction peak 508, as shown in FIG. 10, indicating that the long-wavelength extinction peak 508 is not due to light extinction of the organic groups on the carbon layers.

Example textured crystalline silicon solar cells with the sheets 104 deposited on the front light-receiving surface had a more significant efficiency enhancement 510 than the efficiency enhancement 512 of the same cells with planer sheets deposited on the front light-receiving surface, as shown in FIG. 5(b).

Preferred surface coverage by the sheets 104 is about 100% of the light-receiving area, or about 90% to 100%, or greater than about 95%.

The EQE efficiency improvement 514 from the wrinkled sheets 104 is significant, and more significant that 516 from planar graphene sheets, as shown in FIG. 5(c), particularly in the long wavelengths (around 1050 nm). Scattered light at both short and long wavelengths from the wrinkle-like sheets 104 is trapped inside the solar cell and contributes significantly to conversion of sun light to electrical power.

Manufacturing Method

The manufacturing method includes the following steps: preparing the nanoparticles 102 with a controlled concentration in a fluid by performing the nanoparticle synthesis method; depositing the nanoparticles 102 in a nanoparticle array on the light-receiving surface from the fluid with the controlled concentration; preparing the sheets 104 by performing the sheet synthesis method; and depositing the sheets 104 at least partially over the nanoparticles 102 on the light-receiving surface, or alternatively depositing the sheets 104 on the light-receiving surface before depositing the nanoparticles 102 onto the sheets.

For commercially available textured crystalline silicon solar cells (e.g., from Suntech Co., Ltd.), the integration of the nanoparticles 102 and the graphene sheets 104 can be performed by placing drops of sample suspensions containing the nanoparticles 102 and the sheets 104 (optionally with different concentrations) onto the front surfaces of the photovoltaic devices, then drying the solar cell surface with a stream of nitrogen.

Nanoparticle Synthesis Method

The nanoparticle synthesis method is a modified thermal evaporation method to synthesise the Al nanoparticles 102 by preparing an Al-nanoparticle aqueous suspension.

Figure 2:
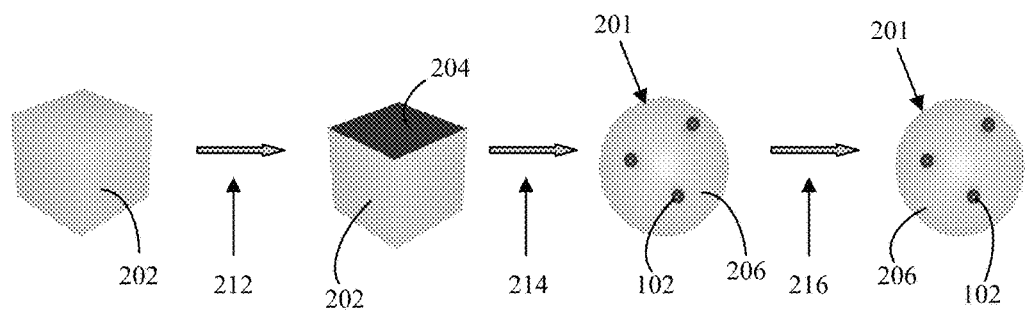
FIG. 2 is a flow chart of a synthesis method for the Al nanoparticles using a modified thermal evaporation method.

As partially shown in FIG. 2, the nanoparticle synthesis method includes the steps of: selecting a nanoparticle size, and a nanoparticle coverage, based on pre-determined desirable values (e.g., about 100 nm, and about 10%); selecting a desirable concentration for a nanoparticle suspension 201 based on the selected nanoparticle coverage; selecting a soluble substrate 202 (e.g., sodium chloride (NaCl) powder, or a crystal substrate dissolvable by a solvent that does not interact with the Al nanoparticles) to support an Al thin film 204, and selecting a solvent 206 (e.g., water) to dissolve the substrate 202; selecting an evaporation thickness of the Al thin film 204, an annealing temperature and an annealing duration to control the size of the nanoparticles 102 (e.g., to give diameters of 50 nm, 100 nm and 150 nm); forming the Al thin film 204 by thermal evaporation of Al onto the substrate 202 (step 212); forming the nanoparticles 102 by annealing the Al thin film 204 on the substrate 202 at the selected temperature for the selected duration, allowing the nanoparticles to form by minimizing the Al surface tension (step 214); forming the nanoparticle suspension 201 by dissolving the substrate 202 (i.e., mixing with the solvent 206 under vigorous stirring), thus removing the solid substrate 202 from the nanoparticles 102; purification of the nanoparticle suspension 201 (step 216), e.g., removing the dissolved substrate 202, centrifuging and washing; and controlling the concentration of the nanoparticle suspension 201 by adding or removing solvent 206 to reach the selected desirable concentration.

The selected soluble substrate 202 is stable and soluble even after the high temperature annealing treatment. The term "annealing" refers to heating, or heat treating, rather than just heating and allowing slow cooling to remove internal stresses and toughen the aluminium. The annealing produces Al nanoparticles from the thin film.

For an example Al thin film thickness of 10 nm, and a desirable nanoparticle average diameters of about 100 nm, the annealing temperature and time were selected to be 400° C. for 90 min.

Controlling the concentration of the nanoparticle suspension 201 can be a much simpler method to control nanoparticle coverage than controlling nanoparticle growth or deposition directly on a solar cell.

The evaporation thickness, the annealing temperature and the annealing duration can be selected using experimental data, e.g., as show in Table 3.

TABLE 3

Annealing temperatures and Al firm thicknesses used for the synthesis of Al nanoparticles with different diameters. The annealing time is 90 min.

| Al nanoparticle diameter (nm) | Annealing temperature (° C.) | Al firm thickness (nm) |
|---|---|---|
| 50 | 400 | 5 |
| 100 | 400 | 10 |
| 150 | 500 | 12 |

Sheet Synthesis Method

Figure 3:
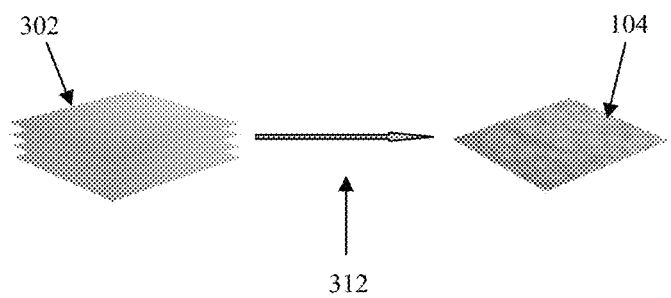
FIG. 3 is a flow chart of a synthesis method for the wrinkle-like graphene sheets.

As partially shown in FIG. 3, the sheet synthesis method includes the steps of: treating graphite 302 with a strong reductant (e.g., $NaBH_4$) to form the sheets 104 (step 312).

The treating step 312 is based on the Hummer method, e.g., described in Reference (7). First, graphite and $NaNO_3$ are mixed with concentrated $H_2SO_4$. Under vigorous stirring, the reducing agent (e.g., $KMnO_4$) is added to the suspension. Then $H_2O_2$ is added to the mixture at 98° C. The graphene oxide suspension is obtained after the purification.

The graphene sheet suspension is prepared by the chemical reduction of the graphene oxide. The strong reductant ($NaBH_4$) is added into the graphene oxide suspension and the mixture is heated at about 100° C. for about 2 hours. After the reaction, the graphene sheet product is centrifuged, washed and dried, then mixed into a suspension for deposition onto the light-receiving surface.

Figure 1C:
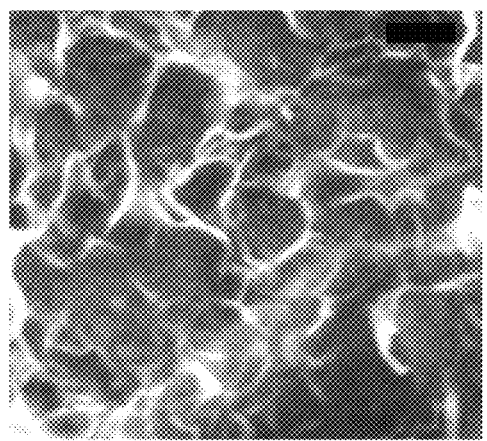
FIG. 1C is an scanning electron microscope (SEM) image of wrinkle-like graphene sheets with a scale bar of 500 nm.

As shown in the SEM image of FIG. 1C, example sheets 104 have wrinkle-like features as a result of the graphite layer treatment by the strong reductant.

As shown in the Raman spectrum of example wrinkle-like sheets 104 of FIG. 9, a strong D band around 1340 nm indicates that the graphene product contains many defects on the carbon sheet formed during the treating step, causing the sheets to wrinkle. Milder reductants, e.g., hydrazine, may not be sufficiently strong to form the wrinkled sheets 104.

LIST OF REFERENCES

The references are:
(1) Atwater, H. A.; Polman, A. *Nature Mater.* 2010, 9, 205-213.
(2) Fahim, N. F.; Jia, B. H.; Shi, Z. R.; Gu, M. *Opt. Express* 2012, 20, A694-A705.
(3) Lassiter, J. B.; Sobhani, H.; Fan, J. A.; Kundu, J.; Capasso, F.; Nordlander, P.; Halas, N. J. *Nano Lett.* 2010, 10, 3184-3189.
(4) Temple, T. L.; Mahanama, G. D. K.; Reehal, H. S.; Bagnall, D. M. *Solar Energy Materials & Solar Cells* 2009, 93, 1978-1985.
(5) Catchpole, K. R.; Polman, A. *Appl. Phys. Lett.* 2008, 93, 191113.
(6) Dai, H.; Li, M. C.; Li, Y. F.; Yu, H.; Bai, F.; Ren, X. F. *Opt. Express* 2012, 20, A502-A509.
(7) Hummers, W. S.; Offeman, R. E. *J. Am. Chem. Soc.* 1958, 80, 1339-1339.

INTERPRETATION

Many modifications will be apparent to those skilled in the art without departing from the scope of the present invention.

The reference in this specification to any prior publication (or information derived from it), or to any matter which is known, is not, and should not be taken as an acknowledgment or admission or any form of suggestion that the prior publication (or information derived from it) or known matter forms part of the common general knowledge in the field of endeavor to which this specification relates.

The invention claimed is:

1. A photovoltaic (PV) structure for generating electrical power from light, the structure including an enhancing layer for increasing the absorption of light incident upon the structure, the enhancing layer including:
   a wrinkled graphene layer configured to trap light with the PV structure, wherein the wrinkled graphene layer has a surface coverage of 100%, wherein the wrinkled graphene layer provides broadband light-trapping effects at optical wavelengths, the wrinkled graphene layer providing an extinction peak at visible wavelengths between 800 nm and 900 nm; and
   aluminium nanoparticles configured to scatter light into the PV structure.

2. The PV structure of claim 1, wherein the wrinkled layer is on a light-receiving side of the nanoparticles.

3. The PV structure of claim 1, wherein the nanoparticles are on a light-receiving side of the wrinkled layer.

4. The PV structure of claim 1, wherein the nanoparticles have a surface coverage of:
   less than 30%; or
   about 5% to 15%; or
   10%.

5. The PV structure of claim 1, wherein the nanoparticles have sizes from 50 nanometers (nm) to about 150 nm; or wherein the nanoparticles have sizes of 100 nm.

6. The PV structure of claim 1, wherein the wrinkled layer is formed of wrinkled graphene sheets.

7. The PV structure of claim 1, wherein the wrinkled graphene layer is formed of wrinkled graphene sheets synthesised by reduction of graphene oxide.

8. The PV structure of claim 1, wherein the extinction peak is provided at a visible wavelength of 850 nm.

* * * * *